US009350074B2

(12) United States Patent
Linnenbrink

(10) Patent No.: US 9,350,074 B2
(45) Date of Patent: May 24, 2016

(54) ACTIVE, ELECTRONICALLY SCANNED ARRAY ANTENNA

(71) Applicant: Thomas Edward Linnenbrink, Colorado Springs, CO (US)

(72) Inventor: Thomas Edward Linnenbrink, Colorado Springs, CO (US)

(73) Assignee: TEQNOVATIONS, LLC, Colorado Springs, CO (US)

( * ) Notice: Subject to any disclaimer, the term of this patent is extended or adjusted under 35 U.S.C. 154(b) by 552 days.

(21) Appl. No.: 13/842,251

(22) Filed: Mar. 15, 2013

(65) Prior Publication Data

US 2014/0266898 A1    Sep. 18, 2014

(51) Int. Cl.
| H01Q 3/00 | (2006.01) |
| H01Q 3/26 | (2006.01) |
| H01P 9/00 | (2006.01) |
| H03K 5/06 | (2006.01) |
| H01Q 3/30 | (2006.01) |

(52) U.S. Cl.
CPC ............... H01Q 3/2682 (2013.01); H01P 9/00 (2013.01); H01Q 3/30 (2013.01); H03K 5/06 (2013.01)

(58) Field of Classification Search
CPC .............. H01Q 3/00; H01Q 3/30; H01P 9/00; H03K 5/00
USPC .......................................................... 342/371
See application file for complete search history.

(56) References Cited

U.S. PATENT DOCUMENTS

| 3,970,790 | A | * | 7/1976 | Guanella | .................. | H04K 1/06 |
| | | | | | | 380/35 |
| 4,799,034 | A | | 1/1989 | Silverman et al. | | |
| 4,912,478 | A | | 3/1990 | Daniel | | |
| 5,130,717 | A | | 7/1992 | Ewen et al. | | |
| 5,140,333 | A | | 8/1992 | Parker | | |
| 5,694,134 | A | | 12/1997 | Barnes | | |
| 6,191,735 | B1 | | 2/2001 | Schineller | | |
| 6,393,177 | B2 | | 5/2002 | Paek | | |
| 6,556,102 | B1 | | 4/2003 | Sengupta et al. | | |
| 6,701,141 | B2 | | 3/2004 | Lam | | |
| 7,209,079 | B2 | | 4/2007 | Easton | | |
| 7,884,766 | B2 | | 2/2011 | Haziza | | |
| 2007/0040628 | A1 | * | 2/2007 | Kanno | ..................... | H01P 3/088 |
| | | | | | | 333/4 |
| 2008/0303742 | A1 | * | 12/2008 | Dybdal | .............. | H01Q 21/0006 |
| | | | | | | 343/893 |
| 2010/0321060 | A1 | * | 12/2010 | Nishio | ................. | H03K 19/003 |
| | | | | | | 326/30 |
| 2011/0084880 | A1 | * | 4/2011 | Sakai | ....................... | G01S 7/282 |
| | | | | | | 342/375 |
| 2011/0237950 | A1 | * | 9/2011 | Meng | ....................... | A61B 8/14 |
| | | | | | | 600/447 |
| 2012/0281502 | A1 | * | 11/2012 | Tsushima | ............ | G10K 11/341 |
| | | | | | | 367/87 |
| 2012/0286983 | A1 | * | 11/2012 | Pfann | ...................... | H03M 1/66 |
| | | | | | | 341/144 |

OTHER PUBLICATIONS

Strunck et al., "Continuously Tunable Phase Shifters for Phased Arrays based on Liquid Crystal Technology." Institut for Microwave Engineering and Photonics, Darmstadt, Germany, pp. 82-88.
PCT International Search Report, mailed Sep. 10, 2014, for corresponding International Application No. PCT/US2014/021325.

(Continued)

Primary Examiner — Harry Liu
(74) Attorney, Agent, or Firm — Husch Blackwell LLP

(57) ABSTRACT

An improved active, electronically scanned array antenna that employs programmable time delays in the transmission feed lines to form timed arrays is provided. A timed array can be implemented as a nested set of transmission lines, and the programmable time delay can be realized as or in each of the transmission lines such that each transmission line can have a fixed physical length and a programmable electrical length.

30 Claims, 4 Drawing Sheets

IN-LINE, TWO-DIMENSIONAL BEAM FORMER (LEVEL 1)

(56) References Cited

OTHER PUBLICATIONS

PCT Written Opinion of the International Searching Authority, mailed Sep. 10, 2014, for corresponding International Application No. PCT/US2014/021325.
Wulf-Dieter Wirth, Radar techniques using array antennas, The Institution of Electrical Engineers, various pages.
Yu Garbovskiy et al., Liquid crystal phase shifters at millimeter wave frequencies, Journal of Applied Physics, Citation: J. Appl. Phys. 111, 054504 (2012); doi: 10.1063/1.3691202.
EE Web, Electrical Engineering Community, Stripline Impedance—PCB Symmetric Stripline Impedance Calculator, www.eeweb.com/toolbox/synnmetric-stripline-impedance.
A. Gaebler et al., Liquid Crystal-Reconfigurable Antenna Concepts for Space Applications at Microwave and Millimeter Waves, International Journal of Antennas and Propagation, vol. 2009, Article ID 876989.
Onur Hamza Karabey et al., A 2-D Electronically Steered Phased-Array Antenna With 2×2 Elements in LC Display Technology, IEEE Transactions on Microwave Theory and Techniques, vol. 60, No. 5, May 2012, pp. 1297-1306.
Nabeel A. Riza et al., Characterization of a Ferroelectric Liquid Crystal-Based Time Delay Unit for Phased Array Antenna Applications, Journal of Lightwave Technology, vol. 15, No. 7, Jul. 1997, pp. 1088-1094.
Nabeel A. Riza, Liquid Crystal-Based Optical Time Delay Units for Phased Array Antennas, Journal of Lightwave Technology, vol. 12, No. 8, Aug. 1994, pp. 1440-1447.
Takao Kuki et al., Microwave Variable Delay Line Using Dual-Frequency Switching-Mode Liquid Crystal, IEEE Transactions on Microwave Theory and Techniques, vol. 50, No. 11, Nov. 2002, pp. 2604-2609.
PCT Notification Concerning Transmittal of International Preliminary Report on Patentability, mailed Sep. 24, 2015, for corresponding International Application No. PCT/US2014/021325.

* cited by examiner

IN-LINE, TWO-DIMENSIONAL BEAM FORMER (LEVEL 1)

BINARY, SWITCHED TIME DELAY, OR TROMBONE LINE
$T = 3T_P + 3T_L + (0:7\Delta t)$

CONTINUOUS, VOLTAGE-VARIABLE TIME DELAY WITH 3-BIT DIGITAL CONTROL
$T = T_{min} + (0:7\Delta t)$

ACTIVE, ELECTRONICALLY SCANNED ARRAY ANTENNA

FIELD

The present invention relates generally to antennas. More particularly, the present invention relates to an active, electronically scanned array ("ESA") antenna.

BACKGROUND

Phase shifters are widely known, made, and used. For example, many known ESA antennas employ programmable phase shifters to form phased arrays. While phased arrays provide many advantages, they also include various disadvantages.

Time delays are known in the art, but array antennas that employ time delays in lieu of phase delays have been difficult to achieve. Accordingly, there is a continuing, ongoing need for an ESA antenna that employs programmable time delays to form timed arrays as opposed to phase arrays.

DETAILED DESCRIPTION

Figure 1:
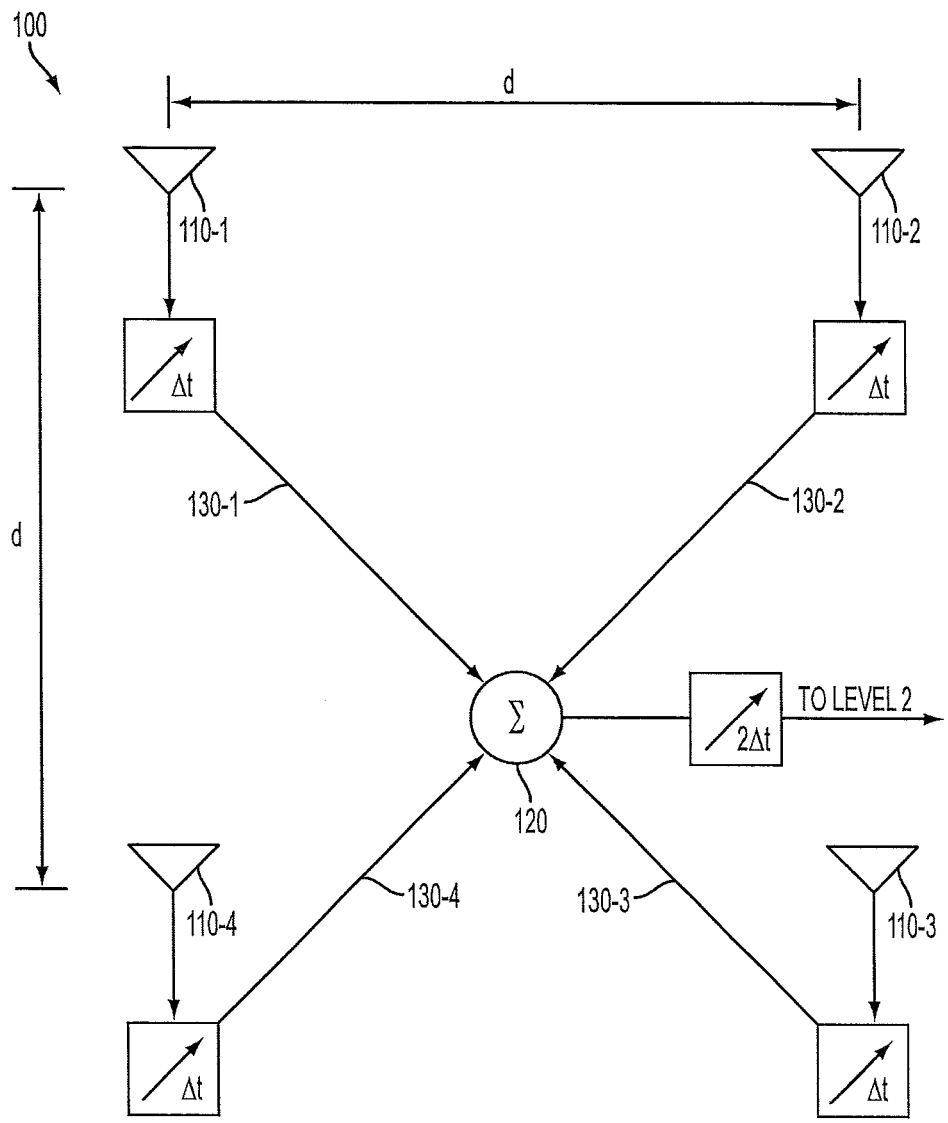
FIG. 1 is a block diagram of a one-level two-dimensional beam former in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein include an ESA antenna that employs programmable time delays in transmission lines to form timed arrays. That is, in some embodiments disclosed herein, programmable phase shifters and phased arrays are not employed, and antenna beam direction can be maintained independent of frequency. An antenna and/or array in accordance with disclosed embodiments can be both light and cost effective.

According to disclosed embodiments, a programmable time delay can be realized as and/or in a transmission line with a fixed physical length and with a programmable electrical length. That is, the transmission line can carry a radio frequency (RF) signal and can also time-delay the signal, as necessary. Accordingly, the transmission line can include the programmable time delay.

In some embodiments, the transmission lines disclosed herein do not require an active component, such as a low-noise amplifier, in the RF signal path to buffer a high insertion loss. However, in some embodiments, one or more active components can be located in the RF signal path.

An antenna in accordance with disclosed embodiments can transmit and/or receive signals. Accordingly, an antenna in accordance with disclosed embodiments can time-delay transmitted and/or received signals. Furthermore, an antenna in accordance with disclosed embodiments can process a single signal beam or multiple signal beams. When time-delaying multiple beams, the beams can be processed completely or partially independently.

An antenna in accordance with disclosed embodiments can be formed from one or more arrays and/or sub-arrays. For example, an array or a sub-array can be coupled together as would be known and desired by one of ordinary skill in the art to form an antenna. Furthermore, an antenna, an array, and/or a sub-array in accordance with disclosed embodiments can be any size or shape as would be known and desired by one of ordinary skill in the art and is not limited by the embodiments specifically disclosed herein. For example, an array or sub-array can include a linear array or an area array.

In some embodiments, an antenna array or sub-array can be implemented as a nested set of transmission lines and can include any number of nested levels as would be known and desired by one of ordinary skill in the art. For example, an array can include one, two, three, or N number of nested levels, and signals in the array or sub-array can be summed in a nested manner, that is, within each nested level.

In receiving embodiments, an antenna, array, and/or sub-array can receive a signal, for example, a wave front, traveling in free space. However, the first element in the antenna, array, or sub-array may receive the wave front before a second element in the antenna, array, or sub-array, for example, if the wave front is disposed at an angle relative to the antenna, array, and/or sub-array. To account for the delay in receiving the signal, the antenna, array, and/or sub-array disclosed herein can have a combined effect of producing a time delay that is equivalent to the delay of the wave front traveling in free space. For example, an antenna, array, and/or sub-array in accordance with disclosed embodiments can produce a range of time delays from 0 to $\Delta t$, where $\Delta t$ is equivalent to the time it takes for the wave front to travel in free space the longest distance between receiving elements in the antenna, array, and/or sub-array. In some embodiments, the range of time delays that can be produced is continuous. However, in some embodiments, the range of time delays that can be produced is controlled digitally, which can result in discrete increments of time.

Figure 2:
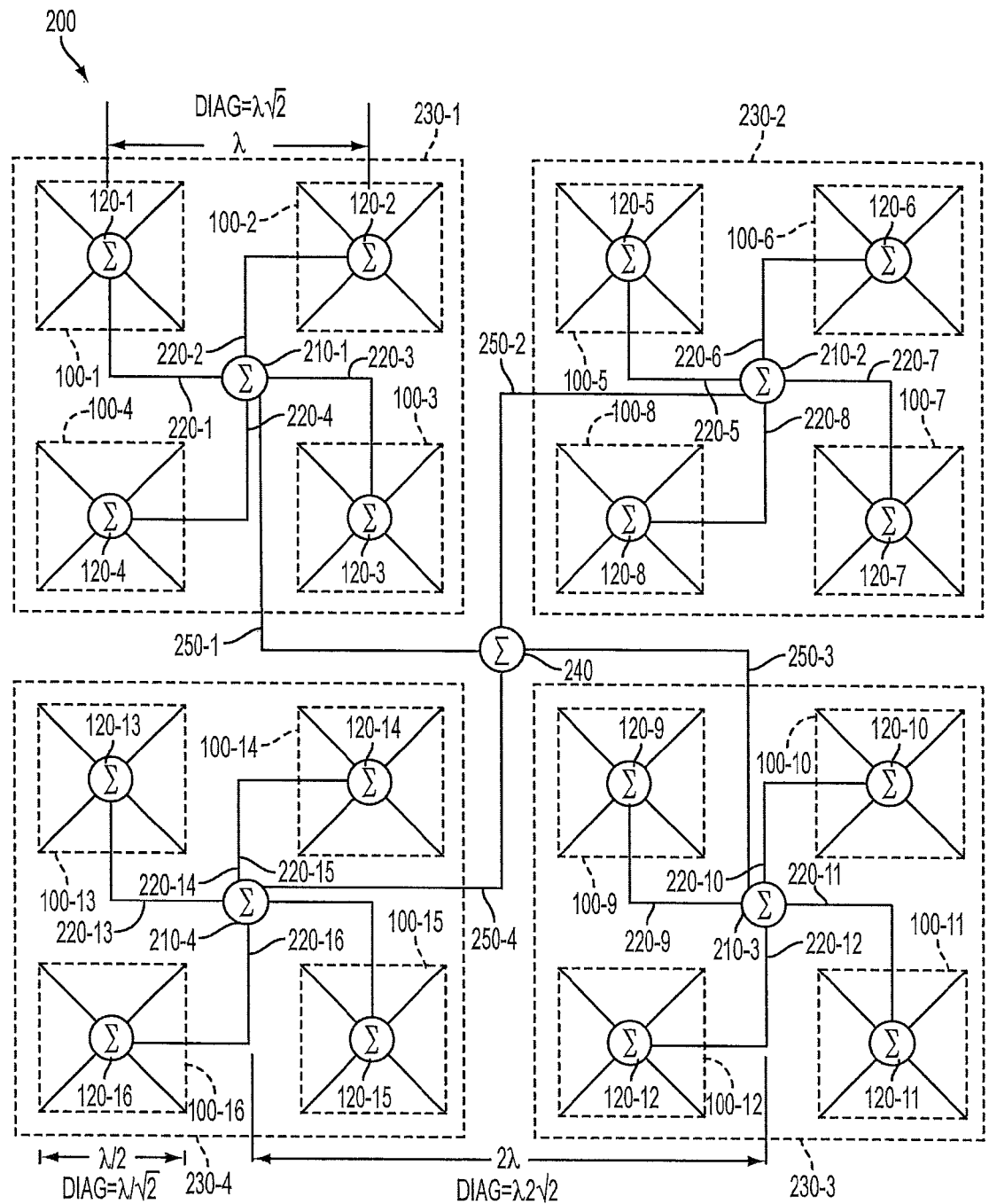
FIG. 2 is a block diagram of a three-level two-dimensional beam former in accordance with disclosed embodiments.

In accordance with the above, FIG. 1 is a block diagram of an exemplary one-level two-dimensional beam former 100 in accordance with disclosed embodiments, and FIG. 2 is a block diagram of an exemplary three-level two-dimensional beam former 200 in accordance with disclosed embodiments. The antenna elements and nested levels shown in FIG. 1 and FIG. 2 are on a square grid. However, it is to be understood that embodiments disclosed herein are not so limited. For example, antenna elements and/or nested levels in accordance with disclosed embodiments can be arranged on any uniform or non-uniform grid, as would be known and desired by one of ordinary skill in the art, for example, a rectangular or triangular grid.

As seen in FIG. 1, a transmission line can physically span the distance between and connect a summing node and a respective antenna element. For example, antenna elements 110-1, 110-2, 110-3, 110-4 can be connected to a summing node 120 by respective transmission lines 130-1, 130-2, 130-3, 130-4. That is, transmission line 130-1 can connect antenna element 110-1 to the summing node 120, transmission line 130-2 can connect antenna element 110-2 to the summing none 120, transmission line 130-3 can connect antenna element 110-3 to the summing node 120, and transmission line 130-4 can connect antenna element 110-4 to the summing node 120.

Although FIG. 1 and FIG. 2 illustrate four transmission lines coupled to each summing node, it is to be understood that embodiments disclosed herein are not so limited. For example, two, three, or N number of transmission lines can be coupled to each summing node, and the summing node can sum the signals received via the transmission lines coupled thereto.

The physical length of each of the transmission lines 130-1, 130-2, 130-3, 130-3, 130-4 can be fixed, but the electrical length of each of the transmission lines 130-1, 130-2, 130-3, 130-4 can be programmable and variable. Accordingly, the electrical length of each of the transmission lines 130-1, 130-2, 130-3, 130-4 can provide a range of delay times that spans the time it takes a signal to travel between elements in free space, for example, in air or in a vacuum. In some embodiments, the smallest delay time can include a variable time delay programmable to 0, but still include a fixed delay that is attributable to the physical path length of the respective transmission line. In some embodiments, the largest delay time can include the time it takes a signal to travel the longest distance in free space between antenna elements. That is, the largest delay time can include the time it takes a signal to travel in free space between the first antenna element 110-1 that receives the signal wave front and the antenna element 110-3, which is located the greatest distance from the first antenna element 110-1.

As seen in FIG. 1, the antenna elements 110-1, 110-2, 110-3, 110-4 can be spaced apart from one another at a distance d, for example, on a square grid. That is, the distance between antenna element 110-1 and antenna element 110-2 can be d, the distance between antenna element 110-2 and antenna element 110-3 can be d, the distance between antenna element 110-3 and antenna element 110-4 can be d, and the distance between antenna element 110-4 and antenna element 110-1 can be d. Accordingly, the diagonal distance between antenna element 110-1 and antenna element 110-3 can be $d\sqrt{2}$, and the diagonal distance between antenna element 110-2 and antenna element 110-4 can be $d\sqrt{2}$.

In accordance with the above, the transmission path between adjacent elements can be the length of the diagonal path, or $d\sqrt{2}$. Accordingly, the time that it takes a signal to travel between adjacent elements in free space can be $\Delta t = (d\sqrt{2})/c$, where c is approximately $3\times10^{10}$ cm/second, which is the speed of light in free space. Therefore, while the fixed length of the transmission path between antenna element 110-1 and antenna element 110-2 can be $d\sqrt{2}$, or the fixed length of transmission line 130-1 plus the fixed length of transmission line 130-2, the variable time that it can take a signal to travel the variable electrical lengths of transmission line 130-1 and transmission line 130-2 can be $0 \leq \Delta t \leq (d\sqrt{2})/c$. Similarly, while the fixed length of the transmission path between antenna element 110-2 and antenna element 110-3 can be $d\sqrt{2}$, or the fixed length of transmission line 130-2 plus the fixed length of transmission line 130-3, the variable time that it can take a signal to travel the variable electrical lengths of transmission line 130-2 and transmission line 130-3 can be $0 \leq \Delta t \leq (d\sqrt{2})/c$. While the fixed length of the transmission path between antenna element 110-3 and antenna element 110-4 can be $d\sqrt{2}$, or the fixed length of transmission line 130-3 plus the fixed length of transmission line 130-4, the variable time that it can take a signal to travel the variable electrical lengths of transmission line 130-3 and transmission line 130-4 can be $0 \leq \Delta t \leq (d\sqrt{2})/c$. While the fixed length of the transmission path between antenna element 110-4 and antenna element 110-1 can be $d\sqrt{2}$, or the fixed length of transmission line 130-4 and the fixed length of transmission line 130-1, the variable time that it can take a signal to travel the variable electrical lengths of transmission line 130-4 and transmission line 130-1 can be $0 \leq \Delta t \leq (d\sqrt{2})/c$.

The beam former 100 shown in FIG. 1 includes one level. However, the one level shown in FIG. 1 can be nested within additional levels. For example, as seen in FIG. 2, the beam former 200 can includes three levels of programmable delay and summation.

In FIG. 2, a transmission line can physically span the distance between and connect a summing node and the respective level-one beam formers. For example, level-one beam formers 100-1, 100-2, 100-3, 100-4 can be connected to a summing node 210-1 by respective transmission lines 220-1, 220-2, 220-3, 220-4. That is, transmission line 220-1 can connect the summing node 120-1 of level-one beam former 100-1 to the summing node 210-1, transmission line 220-2 can connect the summing node 120-2 of level-one beam former 100-2 to the summing node 210-1, transmission line 220-3 can connect the summing node 120-3 of level-one beam former 100-3 to the summing node 210-1, and transmission line 220-4 can connect the summing node 120-4 of level-one beam former 100-4 to the summing node 210-1.

Similarly, level-one beam formers 100-5, 100-6, 100-7, 100-8 can be connected to a summing node 210-2 by respective transmission lines 220-5, 220-6, 220-7, 220-8. That is, transmission line 220-5 can connect the summing node 120-5 of level-one beam former 100-5 to the summing node 210-2, transmission line 220-6 can connect the summing node 120-6 of level-one beam former 100-6 to the summing node 210-2, transmission line 220-7 can connect the summing node 120-7 of level-one beam former 100-7 to the summing node 210-2, and transmission line 220-8 can connect the summing node 120-8 of level-one beam former 100-8 to the summing node 210-2.

Level-one beam formers 100-9, 100-10, 100-11, 100-12, can also be connected to a summing node 210-3 by respective transmission lines 220-9, 220-10, 220-11, 220-12. That is, transmission line 220-9 can connect the summing node 120-9 of level-one beam former 100-9 to the summing node 210-3, transmission line 220-10 can connect the summing node 120-10 of level-one beam former 100-10 to the summing node 210-3, transmission line 220-11 can connect the summing node 120-11 of level-one beam former 100-11 to the summing node 210-3, and transmission line 220-12 can connect the summing node 120-12 of level-one beam former 100-12 to the summing node 210-3.

Finally, level-one beam formers 100-13, 100-14, 100-15, 100-16 can be connected to a summing node 210-4 by respective transmission lines 220-13, 220-14, 220-15, 220-16. That is, transmission line 220-13 can connect the summing node 120-13 of level-one beam former 100-13 to the summing node 210-4, transmission line 220-14 can connect the summing node 120-14 of level-one beam former 100-14 to the summing node 210-4, transmission line 220-15 can connect the summing node 120-15 of level-one beam former 100-15 to the summing node 210-4, and transmission line 220-16 can connect the summing node 120-16 of level-one beam former 100-16 to the summing node 210-4.

The physical length of each of the transmission lines 220-1, 220-2, 220-3, 220-4, 220-5, 220-6, 220-7, 220-8, 220-9, 220-10, 220-11, 220-12, 220-13, 220-14, 220-15, 220-16 can be fixed, but the electrical length of each of the transmission lines 220-1, 220-2, 220-3, 220-4, 220-5, 220-6, 220-7, 220-8, 220-9, 220-10, 220-11, 220-12, 220-13, 220-14, 220-15, 220-16 can be programmable and variable. Accordingly, the electrical length of each of the transmission lines 220-1, 220-2, 220-3, 220-4, 220-5, 220-6, 220-7, 220-8, 220-9, 220-10, 220-11, 220-12, 220-13, 220-14, 220-15, 220-16 can provide a range of delay times that spans the time it takes a signal to travel between elements in free space, for example, in air or in a vacuum. In some embodiments, the smallest delay time can include a variable time delay programmable to 0, but still include a fixed delay that is attributable to the physical path length of the transmission line. In some embodiments, the largest delay time can include the time it takes a signal to travel the longest distance in free space between antenna elements. That is, the largest delay time can include the time it takes a signal to travel in free space between antenna element 110-1 in beam former 100-1 and antenna element 110-3 in beam former 100-3.

In FIG. 2, center points, or level-one summing nodes, of each associated level-one beam former can be spaced apart from one another at a distance $\lambda$ on a square grid. That is, the distance between level-one beam former 100-1 and level-one beam former 100-2 can be $\lambda$, the distance between level-one beam former 100-2 and level-one beam former 100-3 can be $\lambda$, the distance between level-one beam former 100-3 and level-one beam former 100-4 can be $\lambda$, and the distance between level-one beam former 100-4 and level-one beam former 100-1 can be $\lambda$. Accordingly, the distance between level-one beam former 100-1 and level-one beam former 100-3 can be $\lambda\sqrt{2}$, and the distance between level-one beam former 100-2 and level-one beam former 100-4 can be $\lambda\sqrt{2}$.

Similarly, the distance between level-one beam former 100-5 and level-one beam former 100-6 can be $\lambda$, the distance between level-one beam former 100-6 and level-one beam former 100-7 can be $\lambda$, the distance between level-one beam former 100-7 and level-one beam former 100-8 can be $\lambda$, and the distance between level-one beam former 100-8 and level-one beam former 100-1 can be $\lambda$. Accordingly, the distance between level-one beam former 100-5 and level-one beam former 100-7 can be $\lambda\sqrt{2}$, and the distance between level-one beam former 100-6 and level-one beam former 100-8 can be $\lambda\sqrt{2}$.

The distance between level-one beam former 100-9 and level-one beam former 100-10 can also be $\lambda$, the distance between level-one beam former 100-10 and level-one beam former 100-11 can be $\lambda$, the distance between level-one beam former 100-11 and level-one beam former 100-12 can be $\lambda$, and the distance between level-one beam former 100-12 and level-one beam former 100-9 can be $\lambda$. Accordingly, the distance between level-one beam former 100-9 and level-one beam former 100-11 can be $\lambda\sqrt{2}$, and the distance between level-one beam former 100-10 and level-one beam former 100-12 can be $\lambda\sqrt{2}$.

Finally, the distance between level-one beam former 100-13 and level-one beam former 100-14 can be $\lambda$, the distance between level-one beam former 100-14 and level-one beam former 100-15 can be $\lambda$, the distance between level-one beam former 100-15 and level-one beam former 100-16 can be $\lambda$, and the distance between level-one beam former 100-16 and level-one beam former 100-13 can be $\lambda$. Accordingly, the distance between level-one beam former 100-13 and level-one beam former 100-15 can be $\lambda\sqrt{2}$, and the distance between level-one beam former 100-14 and level-one beam former 100-16 can be $\lambda\sqrt{2}$.

In accordance with the above, the transmission path between related and adjacent level-one beam formers can be the length of the diagonal path, or $\lambda\sqrt{2}$. Accordingly, the time that it takes a signal to travel between adjacent elements in free space can be $\Delta t=(\lambda\sqrt{2})/c$, where c is approximately $3\times10^{10}$ cm/second, which is the speed of light in free space.

Therefore, while the fixed length of the transmission path between level-one beam former 100-1 and level-one beam former 100-2 can be $\lambda\sqrt{2}$, or the fixed length of transmission line 220-1 plus the fixed length of transmission line 220-2, the variable time that it can take a signal to travel the variable electrical lengths of transmission line 220-1 and transmission line 220-2 can be $0\le\Delta t\le(\lambda\sqrt{2})/c$. Similarly, while the fixed length of the transmission path between level-one beam former 100-2 and level-one beam former 100-3 can be $\lambda\sqrt{2}$, or the fixed length of transmission line 220-2 plus the fixed length of transmission line 220-3, the variable time that it can take a signal to travel the variable electrical lengths of transmission line 220-2 and transmission line 220-3 can be $0\le\Delta t\le(\lambda\sqrt{2})/c$. While the fixed length of the transmission path between level-one beam former 100-3 and level-one beam former 100-4 can also be $\lambda\sqrt{2}$, or the fixed length of transmission line 220-3 plus the fixed length of transmission line 220-4, the variable time that it can take a signal to travel the variable electrical lengths of transmission line 220-3 and transmission line 220-4 can also be $0\le\Delta t\le(\lambda\sqrt{2})/c$. While the fixed length of the transmission path between level-one beam former 100-4 and level-one beam former 100-1 can be $\lambda\sqrt{2}$, or the fixed length of transmission line 220-4 plus the fixed length of transmission line 220-1, the variable time that it can take a signal to travel the variable electrical lengths of transmission line 220-4 and transmission line 220-1 can be $0\le\Delta t\le(\lambda\sqrt{2})/c$.

Similarly, while the fixed length of the transmission path between level-one beam former 100-5 and level-one beam former 100-6 can be $\lambda\sqrt{2}$, or the fixed length of transmission line 220-5 plus the fixed length of transmission line 220-6, the variable time that it can take a signal to travel the variable electrical lengths of transmission line 220-5 and transmission line 220-6 can be $0\le\Delta t\le(\lambda\sqrt{2})/c$. While the fixed length of the transmission path between level-one beam former 100-6 and level-one beam former 100-7 can be $\lambda\sqrt{2}$, or the fixed length of transmission line 220-6 plus the fixed length of transmission line 220-7, the variable time that it can take a signal to travel the variable electrical lengths of transmission line 220-6 and transmission line 220-7 can be $0\le\Delta t\le(\lambda\sqrt{2})/c$. While the fixed length of the transmission path between level-one beam former 100-7 and level-one beam former 100-8 can also be $\lambda\sqrt{2}$, or the fixed length of transmission line 220-7 plus the fixed length of transmission line 220-8, the variable time that it can take a signal to travel the variable electrical lengths of transmission line 220-7 and transmission line 220-8 can also be $0\le\Delta t\le(\lambda\sqrt{2})/c$. While the fixed length of the transmission path between level-one beam former 100-8 and level-one beam former 100-5 can be $\lambda\sqrt{2}$, or the fixed length of transmission line 220-8 plus the fixed length of transmission line 220-5, the variable time that it can take a signal to travel variable electrical lengths of transmission line 220-8 and transmission line 220-5 can be $0\le\Delta t\le(\lambda\sqrt{2})/c$.

While the fixed length of the transmission path between level-one beam former 100-9 and level-one beam former 100-10 can be $\lambda\sqrt{2}$, or the fixed length of transmission line 220-9 plus the fixed length of transmission line 220-10, the variable time that it can take a signal to travel the variable electrical lengths of transmission line 220-9 and transmission line 220-10 can be $0\le\Delta t\le(\lambda\sqrt{2})/c$. Similarly, while the fixed length of the transmission path between level-one beam former 100-10 and level-one beam former 100-11 can be $\lambda\sqrt{2}$, or the fixed length of transmission line 220-10 plus the fixed length of transmission line. 220-11, the variable time that it can take a signal to travel the variable electrical lengths of transmission line 220-10 and transmission line 220-11 can be $0\le\Delta t\le(\lambda\sqrt{2})/c$. While the fixed length of the transmission path between level-one beam former 100-11 and level-one beam former 100-12 can also be $\lambda\sqrt{2}$, or the fixed length of transmission line 220-11 plus the fixed length of transmission line 220-12, the variable time that it can take a signal to travel the variable electrical lengths of transmission line 220-11 and transmission line 220-12 can also be $0\leq\Delta t\leq(\lambda\sqrt{2})/c$. While the fixed length of the transmission path between level-one beam former 100-12 and level-one beam former 100-9 can be $\lambda\sqrt{2}$, or the fixed length of transmission line 220-12 plus the fixed length of transmission line 220-9, the variable time that it can take a signal to travel the variable electrical lengths of transmission line 220-12 and transmission line 220-9 can be $0\leq\Delta t\leq(\lambda\sqrt{2})/c$.

While the fixed length of the transmission path between level-one beam former 100-13 and level-one beam former 100-14 can be $\lambda\sqrt{2}$, or the fixed length of transmission line 220-13 plus the fixed length of transmission line 220-14, the variable time that it can take a signal to travel variable electrical lengths of transmission line 220-13 and transmission line 220-14 can be $0\leq\Delta t\leq(\lambda\sqrt{2})/c$. Similarly, while the fixed length of the transmission path between level-one beam former 100-14 and level-one beam former 100-15 can be $\lambda\sqrt{2}$, or the fixed length of transmission line 220-14 plus the fixed length of transmission line 220-15, the variable time that it can take a signal to travel the variable electrical lengths of transmission line 220-14 and transmission line 220-15 can be $0\leq\Delta t\leq(\lambda\sqrt{2})/c$. While the fixed length of the transmission path between level-one beam former 100-15 and level-one beam former 100-16 can also be $\lambda\sqrt{2}$, or the fixed length of transmission line 220-15 plus the fixed length of transmission line 220-16, the variable time that it can take a signal to travel the variable electrical lengths of transmission line 220-15 and transmission line 220-16 can also be $0\leq\Delta t\leq(\lambda\sqrt{2})/c$. While the fixed length of the transmission path between level-one beam former 100-16 and level-one beam former 100-13 can be $\lambda\sqrt{2}$, or the fixed length of transmission line 220-16 plus the fixed length of transmission line 220-13, the variable time that it can take a signal to travel variable electrical lengths of transmission line 220-16 and transmission line 220-13 can be $0\leq\Delta t\leq(\lambda\sqrt{2})/c$.

As seen in FIG. 2, a transmission line can also physically span the distance between and connect a summing node and a respective level-two beam former. For example, level-two beam formers 230-1, 230-2, 230-3, 230-4 can be connected to a summing node 240 by respective transmission lines 250-1, 250-2, 250-3, 250-4. That is, transmission line 250-1 can connect the summing node 210-1 of level-two beam former 230-1 to the summing node 240, transmission line 250-2 can connect the summing node 210-2 of level-two beam former 230-2 to the summing node 240, transmission line 250-3 can connect the summing node 210-3 of level-two beam former 230-3 to the summing node 240, and transmission line 250-4 can connect the summing node 210-4 of level-two, beam former 230-4 to the summing node 240.

The physical length of each of the transmission lines 250-1, 250-2, 250-3, 250-4 can be fixed, but the electrical length of each of the transmission lines 250-1, 250-2, 250-3, 250-4 can be programmable and variable. Accordingly, the electrical length of each of the transmission lines 250-1, 250-2, 250-3, 250-4 can provide a range of delay times that spans the time it takes a signal to travel between elements in free space, for example in air or in a vacuum. In some embodiments, the smallest delay time can include a variable time delay programmable to 0, but still include a fixed delay that is attributable to the physical path length of the transmission line. In some embodiments, the largest delay time can include the time it takes a signal to travel the longest distance between antenna elements. That is, the largest delay time can include the time it takes a signal to travel in free space between a first antenna element 110-1 in beam former 110-1 of beam former 230-1 and an the antenna element 110-3 in beam former 100-11 of beam former 230-3, which is located the greatest distance from the first antenna element 110-1.

In FIG. 2, center points, or level-two summing nodes, of each level-two beam former can be spaced apart from one another at a distance $2\lambda$ on a square grid. That is, the distance between level-two beam former 230-1 and level-two beam former 230-2 can be $2\lambda$, the distance between level-two beam former 230-2 and level-two beam former 230-3 can be $2\lambda$, the distance between level-two beam former 230-3 and level-two beam former 230-4 can be $2\lambda$, and the distance between level-two beam former 230-4 and level-two beam former 230-1 can be $2\lambda$. Accordingly, the distance between level-two beam former 230-1 and level-two beam former 230-3 can be $2\lambda\sqrt{2}$, and the distance between level-two beam former 230-2 and level-two beam former 230-4 can be $2\lambda\sqrt{2}$.

In accordance with the above, the transmission path between adjacent level-two beam formers can be the length of the diagonal path, or $2\lambda\sqrt{2}$. Accordingly, the time that it takes a signal to travel between adjacent elements can be $\Delta t=(2\lambda\sqrt{2})/c$, where c is approximately $3\times 10^{10}$ cm/second, which is the speed of light in free space. Therefore, while the fixed length of the transmission path between level-two beam former 230-1 and level-two beam former 230-2 can be $2\lambda\sqrt{2}$, or the fixed length of transmission line 250-1 plus the fixed length of transmission line 250-2, the variable time that it can take a signal to travel the variable electrical lengths of transmission line 250-1 and transmission line 250-2 can be $0\leq\Delta t\leq(2\lambda\sqrt{2})/c$. Similarly, while the fixed length of the transmission path between level-two beam former 230-2 and level-two beam former 230-3 can be $2\lambda\sqrt{2}$, or the fixed length of transmission line 250-2 plus the fixed length of transmission line 250-3, the variable time that it can take a signal to travel the variable electrical lengths of transmission line 250-2 and transmission line 250-3 can be $0\leq\Delta t\leq(2\lambda\sqrt{2})/c$. While the fixed length of the transmission path between level-two beam former 230-3 and level-two beam former 230-4 can also be $2\lambda\sqrt{2}$, or the fixed length of transmission line 250-3 plus the fixed length of transmission line 250-4, the variable time that it can take a signal to travel the variable electrical lengths of transmission line 250-3 and transmission line 250-4 can be $0\leq\Delta t\leq(2\lambda\sqrt{2})/c$. While the fixed length of the transmission path between level-two beam former 230-4 and level-two beam former 230-1 can be $2\lambda\sqrt{2}$, or the fixed length of transmission line 250-4 plus the fixed length of transmission line 250-1, the variable time that it can take a signal to travel the variable electrical lengths of transmission line 250-4 and transmission line 250-1 can be $0\leq\Delta t\leq(2\lambda\sqrt{2})/c$.

As seen in FIG. 2, at each higher level, the maximum variable delay can double. Furthermore, the maximum variable delay of a higher-level beam former can include the maximum variable delay of lower-level beam formers combined with the delay in the higher-level beam former transmission lines. As seen in FIG. 2, antenna elements can be spaced apart from one another at distance d, which is $\lambda/2$, level-one beam formers can be spaced apart from one another at a distance $\lambda$, and level-two beam formers can be spaced apart from one another at a distance $2\lambda$. In some embodiments, a variable time delay can include a plurality of individual time delays in series. For example, if the maximum variable time delay in a transmission line of a level-two beam former can include a plurality of individual time delays in series, the sum of each of the individual time delays in series can still be approximately double a maximum variable time delay of a level-one a transmission line in a level-one beam former.

As also seen in FIG. 2, at each higher level, the physical path length between nodes, that is, between antenna elements and summing nodes, can also double. For example, the transmission path between adjacent antenna elements can be d√2, which is λ/42, the transmission path between adjacent level-one beam formers can be λ√2, and the transmission path between adjacent level-two beam formers can be 2λ√2.

As also seen in FIG. 2, at each higher level, the area in which the transmission lines are placed can quadruple. For example, the transmission lines connecting elements to a respective summing node can be in an area that measures 2d, which is λ, the transmission lines connecting level-one beam formers to a respective summing node can be in an area that measures 4λ, and the transmission lines connecting level-two beam formers to a respective summing node can be in an area that measures 16λ.

In accordance with disclosed embodiments, the scaling between the levels of the nested transmission lines can provide an opportunity to route multiple levels within a single layer of transmission lines, thus forming a compact, planar array. For example, when the nested transmission lines are scaled in accordance with disclosed embodiments, multiple nest levels can be routed within a single layer of transmission lines without any of the transmission lines in the layer crossing another transmission line in the layer. In accordance with disclosed embodiments, additional layers can support additional transmission, lines and summing nodes to form an arbitrarily large array or sub-array.

It is to be understood that the beam former 200 shown in FIG. 2 is exemplary only. For example, a beam former in accordance with disclosed embodiments can include more or less than three levels. Indeed, a beam former in accordance with disclosed embodiments can include as many levels as would be known and desired by one of ordinary skill in the art.

It is also to be understood that the dashed lines of level-one beam formers 100-1, 100-2, 100-3, 100-4, 100-5, 100-6, 100-7, 100-8, 100-9, 100-10, 100-11, 100-12, 100-13, 100-14, 100-15, 100-16 and of level-two beam formers 230-1, 230-2, 230-3, 230-4 shown in FIG. 2 are illustrative only. That is, the dashed lines are not necessarily indicative of any type of boundary, such as a housing. Rather, the dashed lines are intended to show the elements that are included in each referenced beam former.

The transmission lines in accordance with disclosed embodiments, for example, those shown in FIG. 1 and FIG. 2, can include a variable time delay transmission line. For example, in some embodiments, a transmission line can include switches to route the signal path among various fixed lengths of transmission line.

Figure 3:
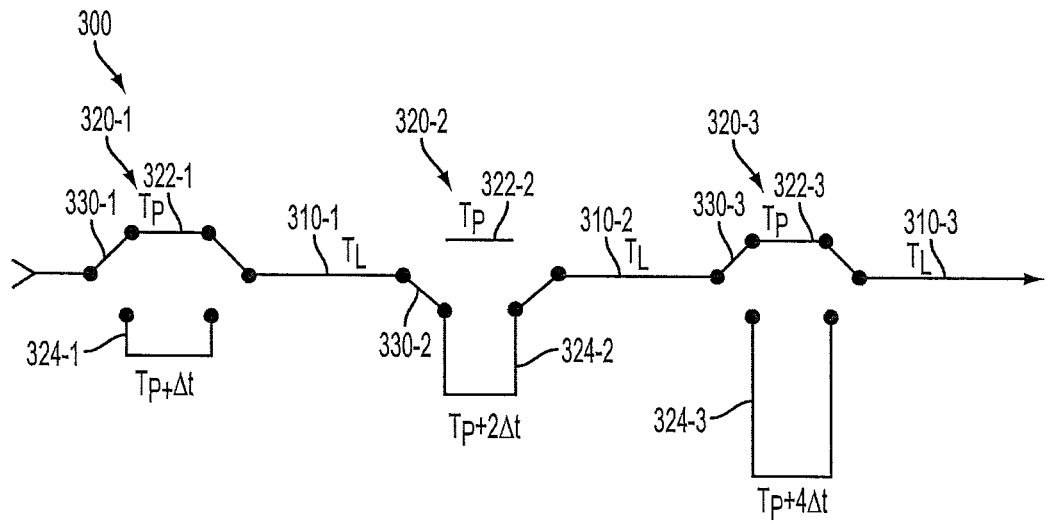
FIG. 3 is a block diagram of a transmission line employing switches in accordance with disclosed embodiments.

FIG. 3 is a block diagram of a transmission line 300 employing switches in accordance with disclosed embodiments. As seen in FIG. 3, the transmission line 300 can include, for example, three fixed stages or paths 310-1, 310-2, 310-3, three switching stages 320-1, 320-2, 320-3, and three switches 330-1, 330-2, 330-3. It is to be understood that the transmission line 300 shown in FIG. 3 is only exemplary and that a transmission line in accordance with disclosed embodiments can include any number of switches and stages, fixed and switching, as would be known and desired by one of ordinary skill in the art.

The time delay of each of the fixed paths 310-1, 310-2, 310-3 can be $T_L$. However, each switching stage 320-1, 320-2, 320-3 can include two distinct paths, each of which has a distinct time delay. For example, stage 320-1 can include path 322-1 and path 324-1. Path 322-1 can have a time delay of $T_P$, and path 324-1 can have a time delay of $T_P+\Delta t$, or a range of programmable delays from 0 to $\Delta t$. Similarly, stage 320-2 can include path 322-2 and path 324-2. Path 322-2 can have a time delay of $T_P$, and path 324-2 can have a time delay of $T_P+2\Delta t$, or a range of programmable delays from 0 to $2\Delta t$. Stage 320-3 can include path 322-3 and 324-3. Path 322-3 can have a time delay of $T_P$, and path 324-3 can have a time delay of $T_P+4\Delta t$, or a range of programmable delays from 0 to $4\Delta t$.

In the first switching stage 320-1, the switch 330-1 can be flipped to route a signal traversing the transmission line 300 through either the path 322-1 or the path 324-1. Similarly, in the second switching stage 320-2, the switch 330-2 can be flipped to route a signal traversing the transmission line 300 through either the path 322-2 or the path 324-2. In the third switching stage 320-3, the switch 330-3 can be flipped to route a signal traversing the transmission line 300 through either the path 322-3 or the path 324-3. Thus, the total time delay for the transmission line 300 can depend on the switches 330-1, 330-2, 330-2 and the paths 322-1 or 324-1, 322-2 or 324-2, 322-3 or 324-3 along which the signal traversing the transmission line 300 travels. That is, the total time delay T for the transmission line 300 can be $T=3T_P+3T_L+(0:7\Delta t)$. In some embodiments, the variable time delay can be executed in discrete time increments of $\Delta t$.

It is to be understood that embodiments of transmission lines in accordance with disclosed embodiments are not limited to those shown in FIG. 3. For example, a transmission line in accordance with disclosed embodiments can be implemented with the embodiment shown in FIG. 4.

Figure 4:
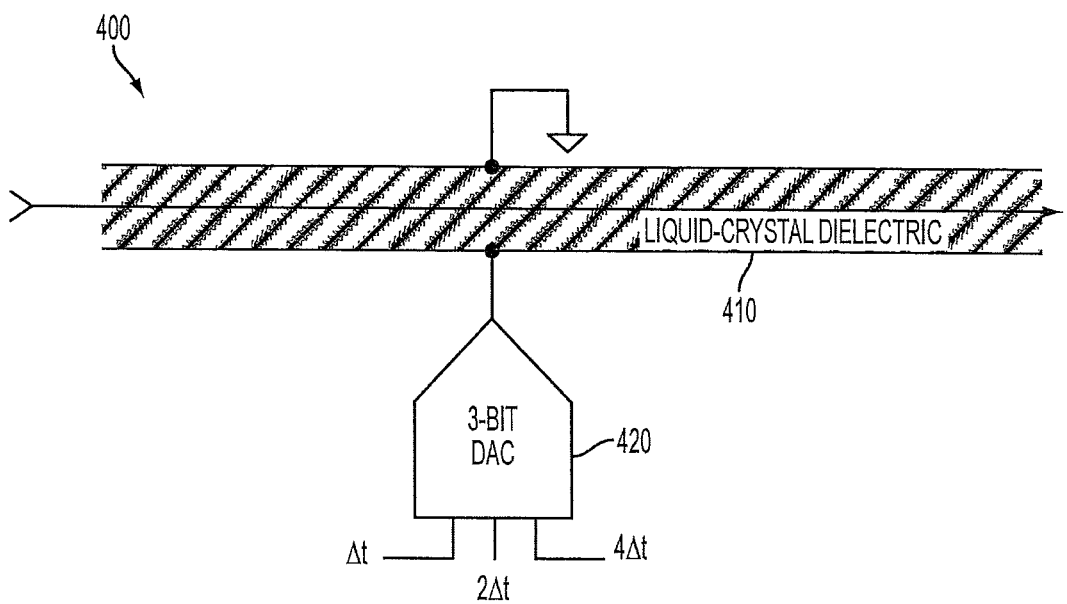
FIG. 4 is a cross-sectional view of a transmission line implemented as a liquid-crystal device in accordance with disclosed embodiments.

As seen in FIG. 4, a programmable and variable time-delay transmission line in accordance with disclosed embodiments can be implemented by varying a dielectric constant of the media through which a signal propagates. In some embodiments, different stages of the transmission line can include a respective, different dielectric constant. In some embodiments, the dielectric constant can be changed in the different stages of the transmission line by varying the electric potential across the media, for example, a piezoelectric material or a liquid-crystal device ("LCD"), through which a signal propagates. For example, the dielectric constant can be changed in an LCD by varying the potential across the LCD over a modest range of bias voltage, for example, 5V.

FIG. 4 is a cross-sectional view a transmission line 400 implemented as a liquid-crystal device in accordance with disclosed embodiments. The dielectric constant of the LCD can be changed by varying the electric potential across the LCD.

For example, the transmission line 400 can include an LCD dielectric 410 and a biasing device, for example, a 3-bit digital-to-analog converter ("DAC") 420, to bias the LCD dielectric 410. Although the DAC 420 shown in FIG. 4 includes a 3-bit resolution, it is to be understood that a DAC in accordance with disclosed embodiments could include any resolution as would be known and desired by one of ordinary skill in the art.

The transmission line 400 can have a minimum time delay of $T_{min}$. However, depending on the selected setting of the DAC 420, the DAC 420 can vary the dielectric constant of the LCD dielectric 410 and cause an additional delay in the transmission line 400 of $\Delta t$, $2\Delta t$, and/or $4\Delta t$. Accordingly, the total time delay T for the transmission line 400 can be $T=T_{min}(0:7\Delta t)$. In some embodiments, the variable time delay can be continuous and/or analog and infinitely variable, but in some embodiments, the time delay can be executed in steps of $\Delta t$.

In some embodiments, a transmission line as disclosed herein can be implemented as a stripline, waveguide, or any other buried-structure device as would be known and desired by one of ordinary skill in the art.

In accordance with disclosed embodiments, an ESA antenna can employ programmable time delays to form timed arrays. In some embodiments, a timed array can include transmission lines as shown and described herein, for example, a transmission line 300 with switches at different stages as shown in FIG. 3 and/or a transmission line 400 that is LCD-based as shown in FIG. 4.

Figure 5:
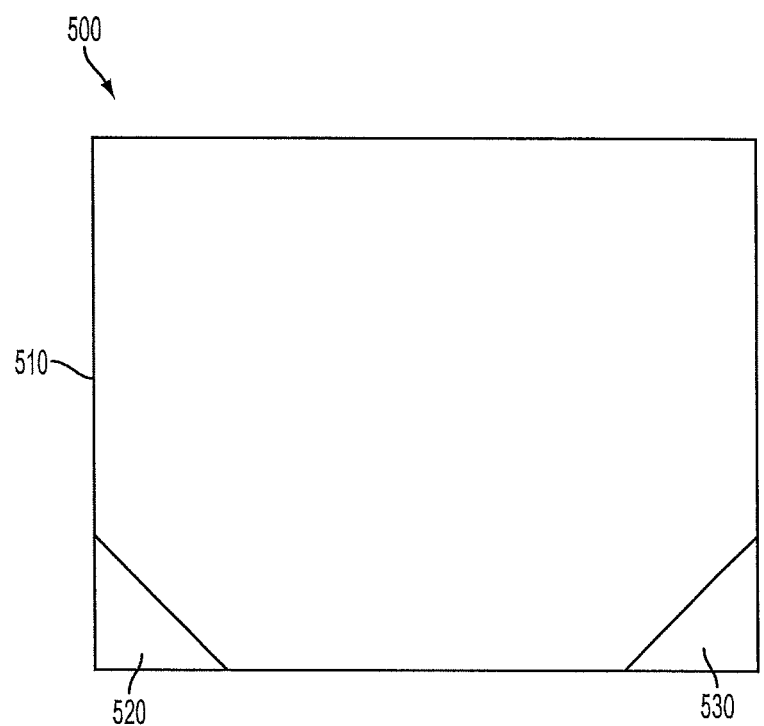
FIG. 5 is a block diagram of a system in accordance with disclosed embodiments.

Any and all of the array antennas, timed arrays, sub-arrays and/or transmission lines shown and described herein can be implemented with the system 500 shown in FIG. 5. For example, the system 500 can include control circuitry 510, one or more programmable processors 520, and executable control software 530 stored on a transitory or non-transitory computer readable medium, including but not limited to, a semiconductor memory, such as random access memory ("RAM") or flash memory. In some embodiments, the executable control software 530 can execute steps to vary the electrical length of the transmission line.

Additionally or alternatively, control of any and all of the array antennas, timed arrays, sub-arrays and/or transmission lines shown and described herein can be implemented with an integrated circuit ("IC"). For example, one or more integrated circuits can be embedded in or on an antenna or array layer that is separate from a layer that includes the antenna elements and beam formers shown and described herein. In some embodiments, an IC can execute steps to vary the electrical length of a transmission line, for example, by controlling voltages to cause a time delay.

Although time delays have been shown and described herein, it is to be understood that the principles of the embodiments disclosed herein can also be applied to programmable and variable impedance. For example, when transmission lines include a programmable time delay, impedance mismatching may occur. Accordingly, embodiments disclosed herein can include a variable and programmable impedance within the transmission line, and the impedances of transmission lines within a beam former can be matched accordingly.

Although a few embodiments have been described in detail above, other modifications are possible. For example, the logic flows described above do not require the particular order described, or sequential order, to achieve desirable results. Other steps may be provided, or steps may be eliminated, from the described flows, and other components may be added to, or removed from, the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the sprit and scope of the invention.

What is claimed is:

1. A beam former comprising:
   a summing node;
   a plurality of antenna elements; and
   a plurality of transmission lines,
   wherein each of the plurality of transmission lines connects the summing node to a respective one of the plurality of antenna elements,
   wherein each of the plurality of transmission lines has a fixed physical length, and
   wherein each of the plurality of transmission lines has a programmable and variable electrical length, and
   wherein a maximum programmable and variable electrical length for the beam former includes a time delay equivalent to a time for a wave front to travel in free space between a first antenna element in the plurality of antenna elements and a second antenna element in the plurality of antenna elements, wherein the first antenna element is a farthest adjacent antenna element from the second antenna element.

2. The beam former of claim 1 wherein each of the plurality of transmission lines includes a first time delay attributable to a respective length of each of the plurality of transmission lines.

3. The beam former of claim 1 wherein an output of the summing node is coupled to a summing node of a higher level beam former.

4. The beam former of claim 1 wherein each of the plurality of transmission lines has a programmable and variable impedance level.

5. An antenna array or sub-array comprising:
   a plurality of first-level beam formers, each of the plurality of first-level beam formers including a first plurality of transmission lines that have a first fixed physical length and a first programmable and variable electrical length; and
   a second-level beam former, the second-level beam former including a second plurality of transmission lines that have a second fixed physical length and a second programmable and variable electrical length,
   wherein output from each of the plurality of first-level beam formers is coupled to the second-level beam former via respective ones of the second plurality of transmission lines.

6. The antenna array or sub-array of claim 5 further comprising a plurality of different levels of beam formers, wherein output from one level of beam formers in the plurality of different levels of beam formers is coupled to a level of beam formers one level higher than the one level of beam formers via respective transmission lines in the level of beam formers one level higher than the one level of beam formers.

7. The antenna array or sub-array of claim 6 wherein signals within each level of beam formers in the plurality of different levels of beam formers are summed within a respective level of beam formers.

8. The antenna array or sub-array of claim 5 wherein each of the plurality of first-level beam formers includes a summing node and a plurality of antenna elements, and wherein each of the first plurality of transmission lines couples the summing node to a respective one of the plurality of antenna elements.

9. The antenna array or sub-array of claim 5 wherein the second-level beam former includes a summing node and the plurality of first level beam formers, and wherein each of the second plurality of transmission lines couples the summing node to a respective one of the plurality of first level beam formers.

10. The antenna array or sub-array of claim 5 wherein a maximum variable time delay of each of the second plurality of transmission lines is approximately double a maximum variable time delay of each of the first plurality of transmission lines.

11. The antenna array or sub-array of claim 10 wherein the maximum variable time delay of each of the second plurality of transmission lines includes a plurality of individual time delays in series, wherein a sum of each of the plurality of individual time delays in series is approximately double the maximum variable time delay of each of the first plurality of transmission lines.

12. The antenna array or sub-array of claim 5 wherein a physical transmission path length between nodes of each of the plurality of second level beam formers is approximately double a physical transmission path length between nodes of each of the plurality of first level beam formers.

13. The antenna array or sub-array of claim 5 wherein each of the first plurality of transmission lines and each of the second plurality of transmission lines are disposed in a single layer.

14. The antenna array or sub-array of claim 13 wherein each of the first plurality of transmission lines obviates crossing each of the second plurality of transmission lines.

15. The antenna array or sub-array of claim 5 coupled to one or more other antenna arrays or sub-arrays to form an antenna.

16. The antenna array or sub-array of claim 5 wherein a maximum programmable and variable electrical length for the antenna array or sub-array includes a time delay equivalent to a time for a wave front to travel in free space between a first antenna element in the antenna array or sub-array and a second antenna element in the antenna array or sub-array, wherein the first antenna element is a farthest antenna element from the second antenna element in the antenna array or sub-array.

17. An antenna comprising:
a plurality of first-level beam formers, each of the plurality of first-level beam formers including a first plurality of transmission lines that have a first fixed physical length and a first programmable and variable electrical length;
a second-level beam former, the second-level beam former including a second plurality of transmission lines that have a second fixed physical length and a second programmable and variable electrical length; and
a control device,
wherein the control device controls and varies the first programmable and variable electrical length of each of the plurality of first level beam formers to time-delay a beam transmitted or received by a respective one of the plurality of first-level beam formers,
wherein the control device controls and varies the second programmable and variable electrical length of the second-level beam former to time-delay a beam transmitted or received by the second-level beam former, and
wherein output from each of the plurality of first-level beam formers is coupled to the second-level beam former via respective ones of the second plurality of transmission lines.

18. The antenna of claim 17 wherein the control device includes one or more programmable processors and executable control software stored on a non-transitory computer readable medium.

19. The antenna of claim 17 wherein the control device includes at least one integrated circuit.

20. The antenna of claim 17 wherein a maximum variable time delay of each of the second plurality of transmission lines is approximately double a maximum variable time delay of each of the first plurality of transmission lines.

21. The antenna of claim 17 wherein a physical transmission path length between nodes of each of the plurality of second-level beam formers is approximately double a physical transmission path length between nodes of each of the plurality of first-level beam formers.

22. The antenna of claim 17 wherein each of the first plurality of transmission lines and each of the second plurality of transmission lines are disposed in a single layer.

23. The antenna of claim 22 wherein each of the first plurality of transmission lines obviates crossing each of the second plurality of transmission lines.

24. The antenna of claim 17 wherein at least one active component is included within an RF signal path.

25. The antenna of claim 17 wherein an RF signal path omits active components therein.

26. The antenna of claim 17 further comprising a plurality of different levels of beam formers, wherein output from one level of beam formers in the plurality of different levels of beam formers is coupled to a level of beam formers one level higher than the one level of beam formers via respective transmission lines in the level of beam formers one level higher than the one level of beam formers.

27. The antenna of claim 17 wherein a maximum programmable and variable electrical length for the antenna includes a time delay equivalent to a time for a wave front to travel in free space between a first antenna element in the antenna and a second antenna element in the antenna, wherein the first antenna element is a farthest antenna element from the second antenna element in the antenna.

28. A transmission line comprising:
a dielectric; and
a biasing device,
wherein the biasing device is disposed across the dielectric and varies a voltage across the dielectric to vary a dielectric constant of the dielectric, which varies a time delay of the dielectric, and
wherein the dielectric includes a liquid-crystal device.

29. The transmission line of claim 28 wherein the biasing device includes a digital-to-analog converter.

30. The transmission line of claim 28 implemented as a stripline.

* * * * *